United States Patent [19]
Wiley

[11] Patent Number: 5,142,775
[45] Date of Patent: Sep. 1, 1992

[54] BONDABLE VIA

[75] Inventor: John P. Wiley, Vestal, N.Y.

[73] Assignee: International Business Machines Corporation, Armonk, N.Y.

[21] Appl. No.: 605,594

[22] Filed: Oct. 30, 1990

[51] Int. Cl.⁵ .............................................. H01K 3/10
[52] U.S. Cl. ...................................... 29/852; 29/830; 156/89
[58] Field of Search ......................... 29/840, 830, 852; 156/89, 901

[56] References Cited

U.S. PATENT DOCUMENTS

| | | | |
|---|---|---|---|
| 3,675,318 | 7/1972 | Merkenschlager | 29/852 |
| 3,739,469 | 6/1973 | Dougherty, Jr. | 29/852 |
| 3,895,435 | 7/1975 | Turner et al. | |
| 4,030,190 | 6/1977 | Varker | |
| 4,211,603 | 7/1980 | Reed | 29/852 X |
| 4,258,468 | 3/1981 | Balde | |
| 4,642,160 | 2/1987 | Burgess | 29/852 X |
| 4,854,038 | 8/1989 | Wiley | |
| 4,864,722 | 9/1989 | Lazzarini | |
| 4,868,350 | 9/1989 | Hoffarth et al. | |

FOREIGN PATENT DOCUMENTS

| | | | |
|---|---|---|---|
| 13157 | 4/1980 | Japan | 29/852 |
| 13159 | 4/1980 | Japan | 29/852 |
| 1-99288 | 4/1989 | Japan | 29/852 |

OTHER PUBLICATIONS

IBM Tech Discl Bull vol. 22 No. 12 May 1980 Plating Holes in Wired Circuit Boards by R. J. Redolphy et al pp. 5301-5302.

IBM Tech Discl Bull vol. 27 No. 5 Oct. 1984, Signal Core by Direct Circuit Deposition by L. N. Chellis et al pp. 2829-2830.

*Primary Examiner*—Carl J. Arbes
*Attorney, Agent, or Firm*—Judith D. Olsen; Richard M. Goldman

[57]    ABSTRACT

A method is disclosed for providing less critical alignment of vias and through holes and lower bonding stresses in the manufacture of high density circuit boards. In the invention, a via is drilled through a land which is in a plane separate from that of the signal plane.

11 Claims, 2 Drawing Sheets

BONDABLE VIA

TECHNICAL FIELD

This invention relates to the stacking of vias in circuit boards. More particularly, the invention is directed to a method which improves registration, thermal stability and reliability of stacked vias, i.e. conductive pathways normal to and connecting selected signal and power planes in a printed circuit board, especially as used in forming a high density circuit board, as well as to the circuit board structures themselves.

BACKGROUND OF THE INVENTION

It is known to form conductor patterns on one or both sides of a number of individual layers of dielectric material, and then to stack and unite such patterned layers to produce a multilayer circuit board. A typical dielectric material used in such multilayer circuit boards is an epoxy-glass material, while the conductor pattern is generally formed from copper, e.g., by selective etching of a thin layer of copper initially covering a layer of the epoxy-glass material or by additive plating. The conductor pattern is comprised of a multitude of fine line paths which terminate on conductive areas called pads or lands. The planes carrying signal lines are called signal planes.

In one method of fabrication of high density multilayer circuit boards, two or more assemblies, called circuitized power cores, as described in U.S. Pat. 4,854,038, which is incorporated herein by reference, comprising two signal planes on either side of one or more power planes are first constructed. Vias are provided for connecting the two signal planes by drilling holes which may range from about 2 mils to about 10 mils in diameter, and an electrically conductive material such as copper is deposited in the vias to make the desired interlayer connection. Drilling is a term used herein to encompass any means for producing a via, including punching and chemical, laser and mechanical hole formation. A multilayer circuit board may be fabricated by stacking and metallurgically bonding two or more circuitized power cores. Reliable electrical connection is required between adjacent vias stacked and bonded in this manner.

In order to provide electrical connections between signal planes, a pad or land of conductive material such as copper is deposited on the outer surface surrounding and in electrical contact with each via. The copper is normally deposited on the pads at the same time as on the fine line paths and in the vias. The lands are stacked, aligned and bonded together with a joining metal, insulation covering signal lines, to form a multilayer structure.

High density packaging configurations comprising small land, via and wiring dimensions will permit fast access to large amounts of data in the next generation of computers, such as in supercomputers. The requirement for high density includes the necessity of increased wiring density and thinner dielectric layers and new materials for the more demanding electrical and mechanical properties required by the high density configurations for enhanced dimensional control.

In the present invention, high density is a term used to describe boards typically made of insulating layers comprising a material having a dielectric constant (Er) of about 4.0 or less, preferably 3.2 to 1.4, at least in the signal line area, in order to provide satisfactorily rapid velocity of signal propagation, reduce unsaturated cross talk, signal noise and attenuation, and still permit the distances between signal planes and power planes to be reduced.

Materials which can be used to provide an Er of 3.2 polytetrafluoroethylene (PTFE), polychlorotri-fluoroethylene (CTFE), and polyperfluoropropylene, and epoxies and cyanates, optionally including filler, such as porous material and certain kinds of quartz or solid or hollow silicon particles, optionally reinforced with fabric such as a mat or woven glass or fluorocarbon fabric. Dielectric materials having an Er between about 3.2 and 1.0 are called high performance dielectric materials, and electrical circuit devices made therewith, especially when the high performance dielectric material is in the signal area, are called high performance circuit devices.

In circuit boards which do not have the stringent dimensional requirements of high density circuit boards, alignment of through holes from layer to layer is made indirectly, using alignment slots and pins. However, in high density circuit boards, the denser circuitry, finer conductor line and track width, thinner dielectric layers, greater number of layers and smaller diameter holes and vias require an absolute, dead-on alignment from layer to layer that is not attainable through means that were satisfactory in the past. In the high density circuitry of the future, through-hole tolerance is such that a small misalignment can mean that there is no electrical interconnection at all, or a highly stressed or high resistance interconnection between the layers where low resistance contact is required. The alignment is thus seen to be a very demanding registration operation. Contributors to alignment problems can include shrinkage of the dielectric material during processing, tooling errors and errors in the artwork used to generate the circuit patterns.

In the past the problems in layer alignment where vias are about 15 mils or less in diameter were noted. In U.S. Pat. 4,566,186 issued Jan. 28, 1986 to Bauer et al, a method is described which includes applying a layer of photoimageable dielectric over a silk screened conductive polymer thick film, which is comprised of a metal dispersed in a polymer. Vias are exposed in the photoimageable dielectric, permitting vias to be as small as about 1 to about 5 mils in diameter. A solder masking step is also included. The techniques and materials described in the '186 patent are quite unlike those of the present invention. The present invention obviates the need for photoimageable dielectric and the associated photolithographic steps.

U.S. Pat. 3,934,335 issued Jan. 27, 1976 to Nelson describes a number of sources of alignment problems and proposed solutions. Unlike the present invention, the '335 patent describes the use of a photoactive dielectric material in a process that seeks to avoid alignment problems and eliminate drilling from layer to layer by applying successive layers of photoactive dielectric, and exposing and developing via openings and circuitry patterns therein.

U.S. Pat. 4,648,179 describes simultaneous bonding at pads of vias filled with bonding metal or alloy, and lamination of polyimide dielectric on a first core to like structures on a second core as a way of avoiding registration problems. The present invention, however, does not require simultaneous lamination of dielectric material and bonding of vias.

However, nowhere in the art is the method or structure of the present invention described, wherein the land areas are placed on a plane separate from the signal planes and perform the dual purpose of easing alignment and enlarging the bond area.

The present invention simplifies alignment, making it possible to provide required faster signal propagation. The present invention, which includes placing larger bonding pads in a plane separate from signal planes, improves via registration from layer to layer, provides greater bonding area, lower stress in the bond between vias, and improves the life and reliability of the via-to-via joint.

Accordingly, it is an object of the invention to provide a method and structure wherein vias joining multilayer, high density circuitry are made and aligned through lands located in a plane separate from signal and power planes.

It is a further object of the invention to provide a printed circuit composite having increased contact land areas at which vias are joined and improved interlayer via registration, thereby reducing mechanical stress at the via joint, reducing contamination, and improving the reliability of the via joint after thermal cycling.

SUMMARY OF THE INVENTION

In the present invention, a circuitized power core (CPC), not heretofore provided with vias, is provided on the exterior major surfaces with conductive pads, optionally apertured, also called lands, on either side at sites designated to be bonding sites for joining vias. The circuitized planes are separated from the lands by a dielectric material. Vias are drilled through designated pads, through the dielectric material and normal to the plane thereof, to a matching pad on the other side. The via is cleaned if necessary and is metallized; the joining pads are also metallized and provided with joining metal. Cores thus prepared are then stacked, aligned via-to-via and laminated into a composite comprised of two or more cores. The ultimate composite is the completed circuit board. Testing and rework can be performed on any level of laminate up to and including the printed circuit board level.

If internal vias are desired, i.e., vias that do not run from one major surface plane of the composite to the other side as a through hole, but rather terminate internally with only one or no external termination, the present invention can still be used. The relaminated core can be laminated to a like core while leaving dielectric over any via and land that is intended to terminate within the ultimate composite rather than at an external surface. The resulting structures, called relaminated cores, and composites laminated therefrom are unique in that the pads which define the end points of the vias lie in a plane separate from any signal and from any power plane. Registration between cores and testing are facilitated because the pads, being on a plane of their own, can be made larger than if they were required to share real estate with lines on a signal plane. The absence of conductive lines on the same plane as the joining pads also reduces the number of shorts due to the spread of heated joining metal.

BRIEF DESCRIPTION OF THE DRAWINGS

In FIG. 4 the vias are stacked and joined at a joining pad on each of the major surfaces of the structure.

DETAILED DESCRIPTION OF THE INVENTION

Figure 1:
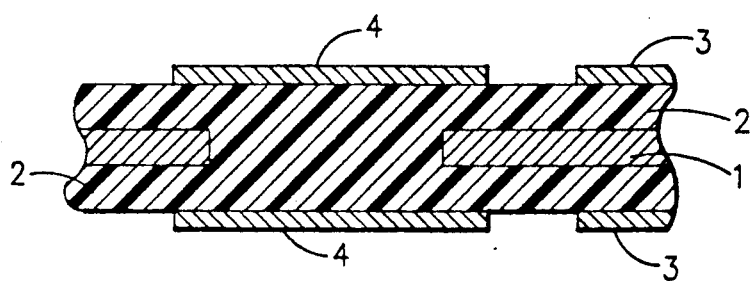
FIG. 1 is a cross-sectional view of a circuitized power core having pads at sites predetermined to be via sites.

A power plane (1) about one mil thick, comprised of Copper-Invar-Copper is provided which has been encapsulated in RO2800, a filled PTFE dielectric material (2), to form a circuitized power core. Invar is a trademark of Imphy, Inc. for an iron-nickel alloy containing about 36% nickel and characterized by an extremely low coefficient of thermal expansion. Alternatively, molybdenum or copper may be used as the power core in place of the Invar. The dielectric material may comprise glass filled epoxy, silica filled Teflon or any of numerous commercially available low dielectric constant materials. Teflon is a trademark of E. I. Dupont de Nemours & Co.; RO2800 is a product of Rogers Corporation. The power plane may be a simple one or may be fabricated as described in U.S. Pat. Nos. 4,864,722 or 4,868,350, which are incorporated herein by reference.

The encapsulated power core is circuitized (3), as in the manner described in U.S. Pat. No. 4,854,038, which is incorporated herein by reference, to form a circuitized power core, with the exception that some or all of the vias are left undrilled and unplated. Pads (4) are provided wherever a via is to be formed. Any vias which are drilled and plated at this point are only those which must be electrically isolated (8) from any other via when the assembly of cores is stacked and laminated. Note that adjacent planes may include isolated vias without recourse to the additional drilling step when they are at the same site. Circuitization without vias has several advantages in process simplification, and the process can be expected to result in a higher quality, lower cost signal plane, a significant benefit of the present invention. The presence of vias at this point can lead to the presence of trapped contaminants, drilling debris on the surface and inferior pad-to-pad contact. For these reasons, the isolated via feature is provided only where required by the product specification; through most planes there would only be stacked vias (9), bonded together with the joining metal, at the bonding pad (7).

Figure 2:
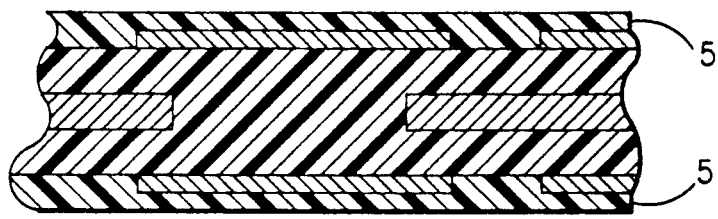
FIG. 2 is the structure of FIG. 1, the exposed surfaces of which have been encapsulated with dielectric material.

The circuitized power core (FIG. 1) is then encapsulated with a low dielectric material (5), which may or may not be the same as the first dielectric material (2). This encapsulating step is normally accomplished by lamination under heat and pressure, but other means, such as dip coating followed by a curing step, may be employed. The completion of this encapsulation step results in the formation of the relaminated core (FIG. 2).

Figure 3:
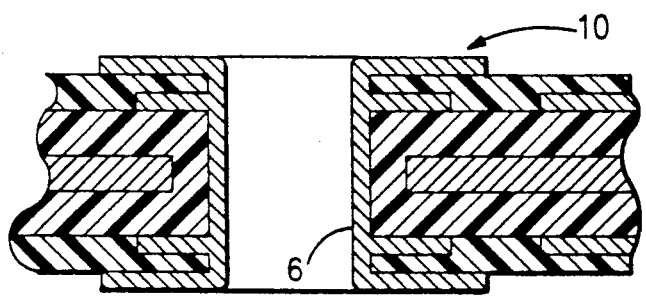
FIG. 3 is the structure of FIG. 2 subsequent to the drilling and metallization of via holes.
Figure 4:
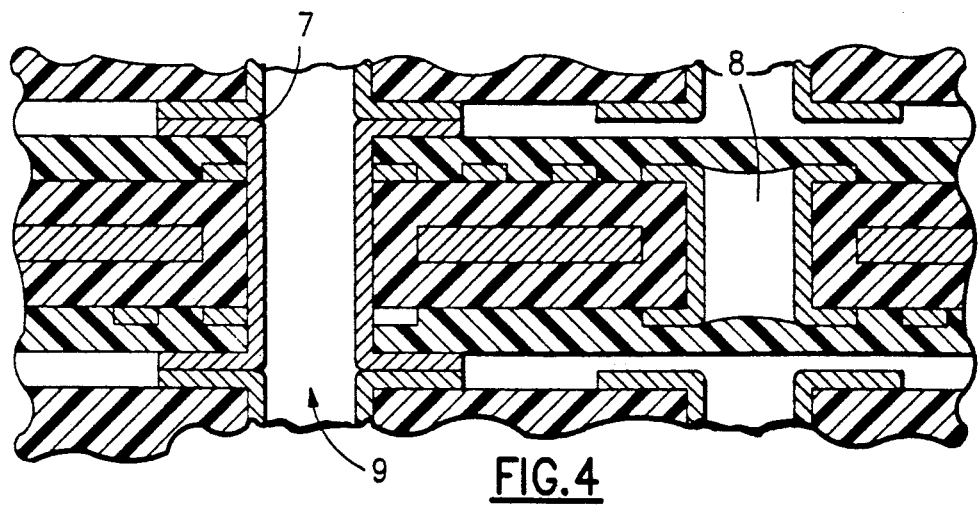
FIG. 4 shows the structure of the present invention as seen in FIG. 3.
Figure 5A:
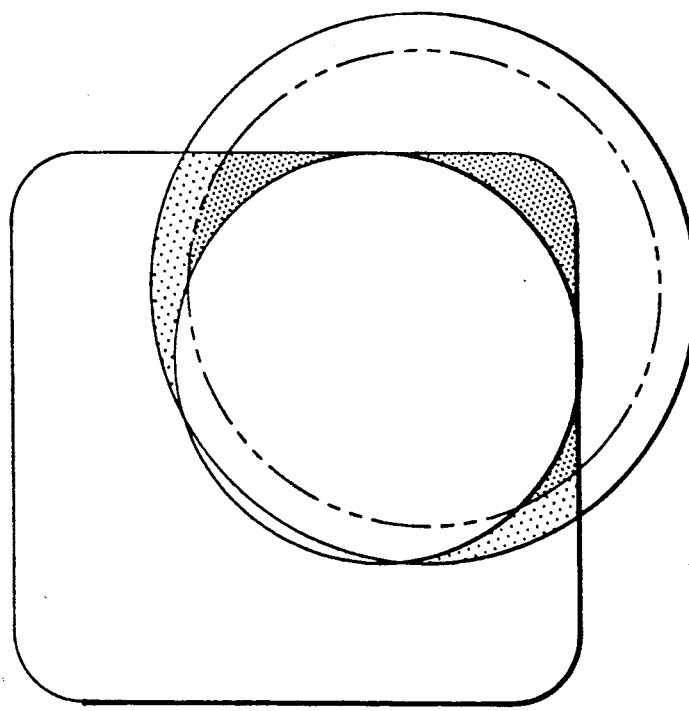
FIG. 5a illustrates a worst case via alignment, top down, resulting from a joining method other than that of the present invention.
Figure 5B:
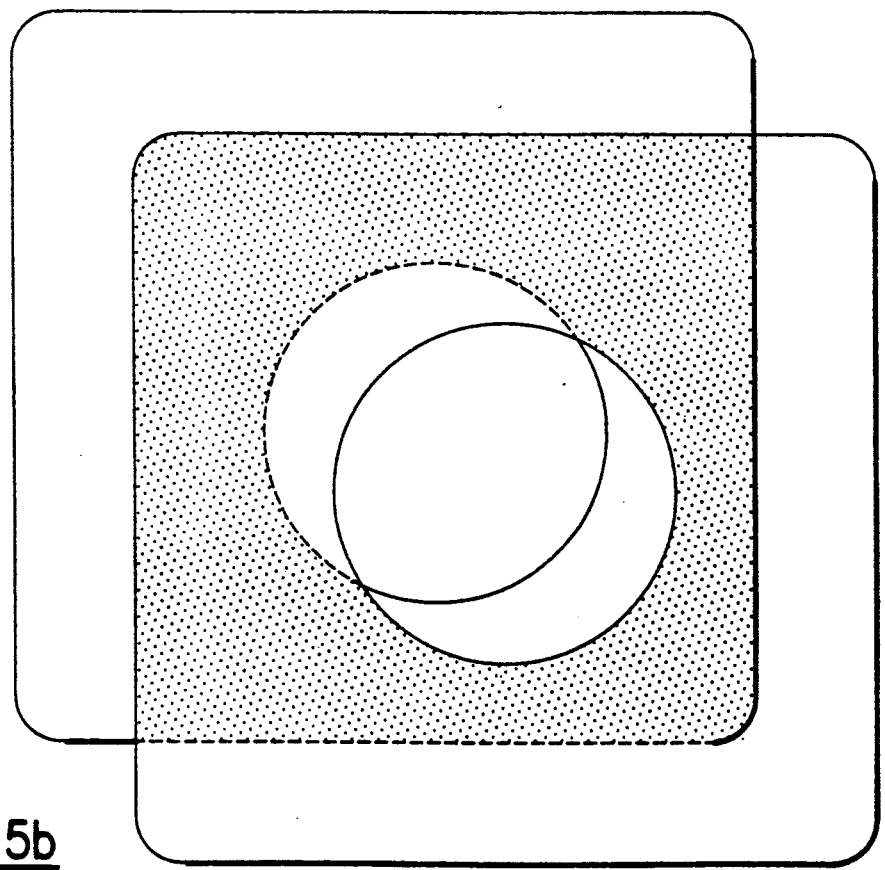
FIG. 5b greatly increased bonding area when joining by the method of the present invention.

Holes are next drilled through the relaminated core, perforating and exposing the pad provided on the signal plane for this purpose. Processing of the circuitizing processes, such as additive copper plating. The circuitization step simultaneously forms a conductive pattern on the surface while metallizing the vias (6). In this invention, the surface circuitizing process produces only metallized bonding pads (10) and vias, the signal lines being in a plane beneath the surface (FIG. 3). The feature of having the pads in a plane separate from that of the signal lines is a primary benefit of the present invention, in that it allows for greatly increased pad area. A large pad area renders registration much easier, ease of registration having become a critical need with the extremely dense circuitry required in the high performance systems. The difference between registration using prior art alignment means and the present invention is illustrated in FIG. 5a and 5b, respectively. The darkened areas of FIGS. 5a and 5b represent the overlap of two joining pads seen from the top down after lamination.

An equally important property is the increased area of the bonding pad itself. The larger area permits a larger contact area between pads when they are coated with joining metal and joined, and provides a joint (7) with greatly improved ability to withstand thermal and mechanical stress, thus increasing the reliability of the joint. An example of these effects follows.

|  | PRIOR ART | INVENTION |
| --- | --- | --- |
| pad size | 125 micron | micron |
| allowable misregistration | 12.5 micron | 65 micron |
| thermal stress | 15,600 psi | 6,500 psi | where the following calculation was performed for joined layer stress, FIG. 5a, RO2800 being the dielectric material:

$$\sigma \approx \frac{A}{a} E \alpha \theta \qquad \frac{A}{a} = 10.35$$
$$\sigma = 52.2 \, \theta \, °C. \qquad E = 0.20 \text{ mpsi}$$
$$\theta = 300° C. \qquad \alpha = 14 \text{ ppm/°F.}$$
$$\sigma = 15,600 \text{ lb/in}^2$$

where
  A = Dielectric area for each joint
  a = Bonding pad area
  E = Elastic modulus of dielectric
  $\theta$ = Maximum temperature
  $\sigma$ = Unit stress and
  $\alpha$ = Expansion coefficient of dielectric Note that in the example calculated, the thermal stress has improved over the prior art by a factor of 2.4 and the allowable misregistration by 5.2.

It will be apparent to one skilled in the art that while the present invention was intended to overcome problems in high density, high performance circuitized structures, it is applicable to circuitized structures having less stringent requirements as well. One skilled in the art may make various modifications and changes to the methods and apparati described herein without departing from the spirit and scope of this invention.

What is claimed is:

1. A method of forming a multilayer printed circuit board comprising the steps of:
    a. circuitizing a first dielectric to form a circuitization plane having circuitization leads and first pads thereon;
    b. encapsulating the circuitization plane and the pads thereon with a second dielectric layer to form a relaminated core;
    c. drilling through the second dielectric layer, a pad on the first circuitization plane, and the first dielectric to form a via or through hole;
    d. depositing Cu in the via or through hole and on the second dielectric layer in proximity to the said via or through hole to form a plated via or through hole and a second pad, thereby forming a multilayer, relaminated core having a circuitization plane with circuitization leads and first pads and a bonding plane with a second pad, said second pad being separated from a corresponding first pad by the second layer of dielectric; and
    e. bonding said multilayer, relaminated core to another multilayer, relaminated core at facing pads thereon to form a stacked via joined at a bonding pad.

2. The method recited in claim 1, wherein the step of providing pads comprises providing centrally apertured pads.

3. The method recited in claim 1, wherein the step of encapsulating comprises encapsulating with a high performance dielectric material.

4. The method recited in claim 1, wherein the step of encapsulating comprises encapsulating with a high performance dielectric material selected from the group consisting of epoxies, fluoropolymers and cyanates.

5. The method recited in claim 1 wherein the step of providing pads comprises providing unapertured pads.

6. The method recited in claim 1 wherein the step of drilling comprises drilling by laser beam.

7. The method recited in claim 1, wherein the step of drilling comprises drilling mechanically.

8. The method recited in claim 1, wherein the step of drilling comprises punching.

9. The method recited in claim 1 wherein the step of metallizing the drilled vias includes providing at least one joining pad with joining metal.

10. The method recited in claim 1, wherein the step of providing a first circuitized power core comprises providing a first, undrilled, circuitized power core.

11. The method recited in claim 1, wherein the step of providing a first circuitized power core comprises providing a first, drilled, circuitized power core.

* * * * *